(12) United States Patent
Harada

(10) Patent No.: US 7,295,647 B2
(45) Date of Patent: Nov. 13, 2007

(54) DRIVER FOR BIDIRECTIONAL SHIFT REGISTER

(75) Inventor: Kenji Harada, Fukaya (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 162 days.

(21) Appl. No.: 11/287,288

(22) Filed: Nov. 28, 2005

(65) Prior Publication Data
US 2006/0159217 A1  Jul. 20, 2006

(30) Foreign Application Priority Data
Jan. 18, 2005  (JP) ............................. 2005-010773

(51) Int. Cl.
*G11C 19/00* (2006.01)
(52) U.S. Cl. .......................................... 377/64; 377/69
(58) Field of Classification Search ..................... None
See application file for complete search history.

(56) References Cited

U.S. PATENT DOCUMENTS 5,815,129 A * 9/1998 Jung ............................. 345/93
6,418,182 B1 * 7/2002 Suyama et al. ................ 377/69
6,501,456 B1 * 12/2002 Saito et al. ..................... 345/98
7,023,415 B2 * 4/2006 Fujita et al. .................... 345/98

FOREIGN PATENT DOCUMENTS

JP  10-74062  3/1998

* cited by examiner

Primary Examiner—Tuan T. Lam
(74) Attorney, Agent, or Firm—Oblon, Spivak, McClelland, Maier & Neustadt, P.C.

(57) ABSTRACT

In order to improve the reliability of the operation of switching the scan direction in a bidirectional shift register without using a complex circuit configuration or complex timing, a clock signal is maintained at a high level by a controller around the timing of the switching of the scan direction in a bidirectional shift register including a plurality of stages of unit shift registers connected to each other in which the scan direction is switched. Alternatively, a power supply VDD is connected to the output terminal of a first clocked inverter in the unit shift register of any one of the odd-numbered stages through third and fourth transfer gates, which become conducting at the same timing as first and second transfer gates of the input terminal of the first clocked inverter, respectively.

2 Claims, 14 Drawing Sheets

DRIVER FOR BIDIRECTIONAL SHIFT REGISTER

CROSS-REFERENCE TO RELATED APPLICATIONS

This application is based upon and claims the benefit of priority from Japanese Patent Application No. 2005-10773 filed on Jan. 18, 2005; the entire contents of which are incorporated herein by reference.

BACKGROUND OF THE INVENTION

1. Field of the Invention

The present invention is applied to a driver of an image display device and relates to a driver for a bidirectional shift register in which the propagation direction of pulse signals can be switched between the forward direction and the reverse direction.

2. Description of the Related Art

In image display devices typified by liquid crystal displays and organic EL display devices, a shift register has been widely used in a signal line driver which generates timing signals for sequentially driving signal lines or a scan line driver which generates scan signals for sequentially driving scan lines.

In various recent instruments such as mobile phones and electronic viewfinders for video cameras, a liquid crystal display device is often used for displaying an image. Further, many instruments have been developed which include rotation mechanisms for rotating the orientations of liquid crystal display devices in order to improve ease of use. In each of these instruments, it is desired that an image inverted vertically or horizontally be displayed according to the rotation angle of a display screen.

A liquid crystal projector includes a separation optical system which separates light from a light source into three primary colors, three light bulbs which control the separated lights according to an image, a combining optical system which combines the controlled lights, a projection optical system which enlarges and projects the combined light, and the like. These optical systems combine images formed by the light bulbs using a plurality of mirrors. However, since the number of mirrors used in each light bulb is different from each other, it is necessary to invert the image of a specific light bulb.

Moreover, the liquid crystal projector projects the combined image onto a screen. Methods for this projection include front projection in which the image is projected from the front side of the screen and rear projection in which the image is projected from the back side of the screen. In both cases, the image needs to be inverted.

The inversion of the image is realized by using a bidirectional shift register in a signal line driver in the case of horizontal inversion or in a scan line driver in the case of vertical inversion. As a bidirectional shift register, for example, one described in Japanese Unexamined Patent Publication No. Hei 10-74062 has been known.

However, known bidirectional shift registers require complex circuit configurations. This causes an increase in the number of interconnections, an increase in circuit scale, and an increase in power consumption. Further, since a first frame of a moving video picture immediately after the switching of the propagation direction of pulse signals is interrupted, the video cannot be displayed smoothly. Furthermore, since complex timing control is required in the switching of the propagation direction, timing design for the controller is complex.

SUMMARY OF THE INVENTION

An object of the present invention is to improve the reliability of the operation of switching the propagation direction of pulse signals without using a complex circuit configuration or complex timing in a bidirectional shift register.

A first aspect of the present invention is a driver which drives a bidirectional shift register including a plurality of stages of unit shift registers connected to each other. Each shift register includes: a first clocked inverter; an inverter having an input terminal connected to an output terminal of the first clocked inverter; a second clocked inverter having an input terminal connected to an output terminal of the inverter and having an output terminal connected to a connection point between the first clocked inverter and the inverter; a first transfer gate having one end connected to an input terminal of the first clocked inverter; and a second transfer gate having one end connected to a connection point between the first clocked inverter and the first transfer gate. In the bidirectional shift register, other end of the first transfer gate in the unit shift register of the leading stage and other end of the second transfer gate in the unit shift register of the last stage are connected to a terminal to which a start pulse signal is supplied. In each of the unit shift registers of other stages, other end of the first transfer gate is connected to the output terminal of the first clocked inverter in the unit shift register of the preceding stage, and other end of the second transfer gate is connected to the output terminal of the first clocked inverter in the unit shift register of the following stage. In each of the unit shift registers of the odd-numbered stages, the first clocked inverter operates in a period in which a clock signal is at a high level, and the second clocked inverter operates in a period in which an inverted clock signal is at a high level. In each of the unit shift registers of the even-numbered stages, the first clocked inverter operates in a period in which the inverted clock signal is at a high level, and the second clocked inverter operates in a period in which the clock signal is at a high level. A scan direction is switched by bringing any one of the first and second transfer gates in each unit shift register into conduction. The driver includes a controller which fixes the clock signal of the bidirectional shift register to a high level around the timing of the switching of the scan direction.

In this invention, the clock signal at a high level is given to the first clocked inverters around the timing of the switching of the scan direction. By doing so, even if the potentials of output interconnections of the first clocked inverters of the odd-numbered stages fluctuate to become potentials different from original proper potentials under the influence of coupling through parasitic capacitances and the like, the first clocked inverters are in operating states. This enables the potentials of the output interconnections to be recharged to original proper potentials. Thus, malfunction can be prevented before it occurs.

Further, even if the first and second transfer gates are conducting at the same time, in the switching of the scan direction, in each unit shift register because of a delay in the control signal, the potentials of the output interconnections of the first clocked inverters in the odd-numbered stages are maintained at proper potentials. Thus, malfunction can be prevented before it occurs.

Thus, a significant modification of the circuit is not required, and the reliability of the operation of switching the scan direction can be improved by merely performing easy timing settings.

A second aspect of the present invention is a bidirectional shift register including a plurality of stages of unit shift registers connected to each other. Each shift register includes: a first clocked inverter; an inverter having an input terminal connected to an output terminal of the first clocked inverter; a second clocked inverter having an input terminal connected to an output terminal of the inverter and having an output terminal connected to a connection point between the first clocked inverter and the inverter; a first transfer gate having one end connected to an input terminal of the first clocked inverter; and a second transfer gate having one end connected to a connection point between the first clocked inverter and the first transfer gate. Other end of the first transfer gate in the unit shift register of the leading stage and other end of the second transfer gate in the unit shift register of the last stage are connected to a terminal to which a start pulse signal is supplied. In each of the unit shift registers of other stages, other end of the first transfer gate is connected to the output terminal of the first clocked inverter in the unit shift register of the preceding stage, and other end of the second transfer gate is connected to the output terminal of the first clocked inverter in the unit shift register of the following stage. In each of the unit shift registers of the odd-numbered stages, the first clocked inverter operates in a period in which a clock signal is at a high level, and the second clocked inverter operates in a period in which an inverted clock signal is at a high level. In each of the unit shift registers of the even-numbered stages, the first clocked inverter operates in a period in which the inverted clock signal is at a high level, and the second clocked inverter operates in a period in which the clock signal is at a high level. A scan direction is switched by bringing any one of the first and second transfer gates in each unit shift register into conduction. The bidirectional shift register includes: a third transfer gate which becomes conducting at the same time as the first transfer gates do; a fourth transfer gate which becomes conducting at the same time as the second transfer gates do; and a power supply to which the output terminal of the first clocked inverter in the unit shift register of any one of the odd-numbered stages is connected through the third and fourth transfer gates.

In this invention, the output terminal of the first clocked inverter in the unit shift register of any one of the odd-numbered stages is connected to the power supply through the third transfer gate, which becomes conducting at the same time as the first transfer gates do, and the fourth transfer gate, which becomes conducting at the same time as the second transfer gates do. Thus, in the switching of the scan direction, even if the first and second transfer gates are conducting at the same time because there occurs a significant delay difference between the control signal and the inverted control signal for scan direction switching, which are respectively supplied to the first and second transfer gates, the third and fourth transfer gates are also conducting at the same time. Accordingly, proper potentials are supplied from the power supply through the third and fourth transfer gates to the output interconnections of the first clocked inverters of the odd-numbered stages regardless of whether the first clocked inverters of the odd-numbered stages are in ON or OFF states. Thus, malfunction can be prevented before it occurs.

BRIEF DESCRIPTION OF THE DRAWINGS

FIG. 3A illustrates schematic symbols. FIG. 3B is a circuit diagram. FIG. 3C illustrates an equivalent circuit for the case where a control signal REV is at a high level. FIG. 3D illustrates an equivalent circuit for the case where the control signal REV is at a low level.

DESCRIPTION OF THE EMBODIMENTS

First Embodiment

Figure 1:
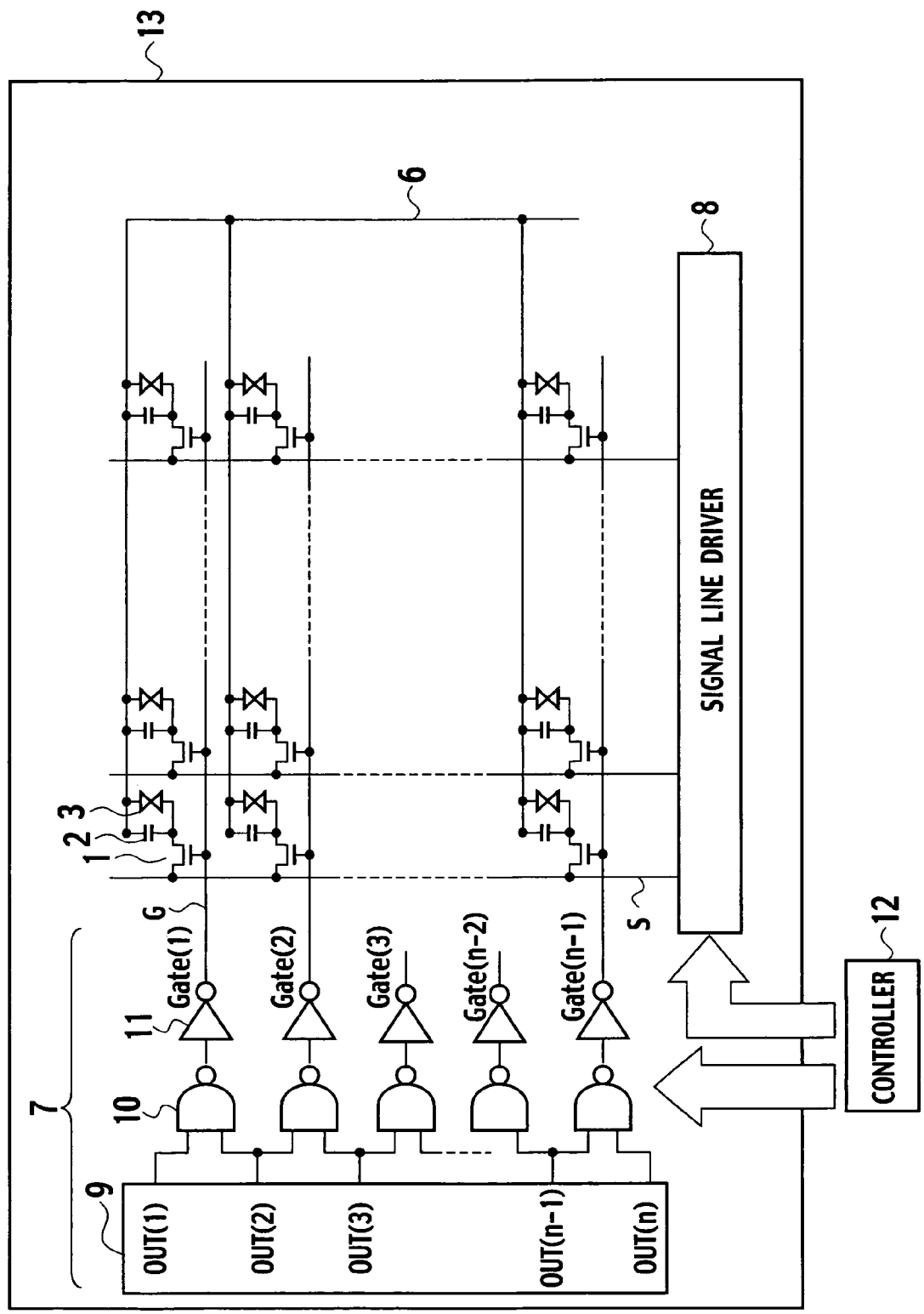
FIG. 1 illustrates the circuit configuration of a liquid crystal display device to which a bidirectional-shift register driver of a first embodiment is applied.

FIG. 1 illustrates a circuit configuration for the case where a bidirectional-shift register driver of this embodiment is applied to a liquid crystal display device. This liquid crystal display device has, on an array substrate 13 made of glass, a plurality of scan lines G and a plurality of signal lines S which are routed so as to intersect with each other, a scan line driver 7 for driving the scan lines G, a signal line driver 8 for driving the signal lines S, and pixels respectively provided at the intersections between the scan lines G and the signal lines S. The liquid crystal display device further has a controller 12 on a flexible substrate.

In the liquid crystal display device, a counter substrate made of glass is placed to face the array substrate, and a liquid crystal layer is formed in a space between the array and counter substrates. On a surface of the array substrate, a pixel electrode is formed for each pixel so as to be in contact with the liquid crystal layer. On a surface of the counter substrate, a counter electrode is formed so as to be in contact with the liquid crystal layer.

Each pixel includes an n-channel MOS thin-film transistor 1, a storage capacitor 2, and a liquid crystal capacitor 3. The thin-film transistor 1 has a source terminal to which a signal line S is connected, a gate terminal to which a scan line G is connected, and a drain terminal to which one terminal of the storage capacitor 2 and the pixel electrode are connected. A common electrode line 6 is connected to the other terminals of the storage capacitors 2 and the counter electrode. This provides a configuration in which the liquid crystal capacitors 3 are connected between the counter electrode and the pixel electrodes. It should be noted that a pixel in this embodiment is a minimum element of an image displayed on the liquid crystal display device.

The scan line driver 7 includes a bidirectional shift register 9, a plurality of NANDs 10 provided in output stages of the bidirectional shift register, and a plurality of buffers 11 respectively provided in output stages of the NANDs 10. The bidirectional shift register 9 can drive the scan lines G while switching the scan direction. Each NAND 10 receives the outputs of two consecutive stages of the bidirectional shift register 9, and outputs the negation of the conjunction thereof. The buffers 11 amplify the driving abilities of the output signals of the NANDs 10 and output the resultant signals to the scan lines G, respectively.

The scan line driver 7 and the signal line driver 8 are formed on the array substrate 13 by the same manufacturing process as that for forming the thin-film transistors 1 of the pixels. This makes it possible to manufacture the thin-film transistors, the scan line driver 7, and the signal line driver 8 simultaneously and to reduce the number of components constituting a peripheral circuit of the liquid crystal display device. Further, component cost and implementation-related cost can be reduced, and the size of a frame around a display part can be reduced. Thus, an inexpensive liquid crystal display device can be realized.

The controller 12 outputs a control signal REV, an inverted control signal /REV, a clock signal CK, an inverted clock signal /CK, a start pulse ST, and the like to the scan line driver 7; and outputs the clock signal CK, the inverted clock signal /CK, a video signal, and the like to the signal line driver 8.

An overview of the operation of the liquid crystal display device is as follows. The scan line driver 7 sequentially drives the scan lines G. Specifically, the scan line driver 7 applies, to a scan line G to be driven, a scan signal which turns on the thin-film transistors 1 connected to the relevant scan line. The signal line driver 8 applies to the signal lines S video signals having voltages according to data on an image to be displayed. Thus, the video signals supplied through the signal lines S are applied to the storage capacitors 2 and the liquid crystal capacitors 3 through the thin-film transistors 1 which are in ON states. The scan line driver 7 sequentially applies a scan signal which turns off the thin-film transistors 1 to the scan line G in which the thin-film transistors 1 are on. After the thin-film transistors 1 have been turned off, voltages applied to the storage capacitors 2 and the liquid crystal capacitors 3 are maintained until the next scan. The entire image is displayed by sequentially driving the scan lines G as described above.

Next, the configuration of the bidirectional shift register 9 will be described using FIG. 2. This bidirectional shift register has a configuration in which n stages (n is a positive odd number) of unit shift registers are connected. Each unit shift register includes a first clocked inverter 61, a second clocked inverter 62, an inverter 63, a first transfer gate 64, and a second transfer gate 65.

In each odd-numbered stage, the first clocked inverter 61 inverts the input signal thereto and outputs the inverted signal during a period in which the clock signal CK is at a high level. The second clocked inverter 62 inverts the input signal thereto and outputs the inverted signal during a period in which the inverse /CK of the clock signal is at a high level.

In each even-numbered stage, the first clocked inverter 61 inverts the input signal thereto and outputs the inverted signal during a period in which the inverse /CK of the clock signal is at a high level. The second clocked inverter 62 inverts the input signal thereto and outputs the inverted signal during a period in which the clock signal CK is at a high level.

In each unit shift register, the output terminal of the first clocked inverter 61, the output terminal of the second clocked inverter 62, and the input terminal of the inverter 63 are connected to each other. Further, the output terminal of the inverter 63 is connected to the input terminal of the second clocked inverter 62. The second clocked inverter 62 and the inverter 63 form a latch circuit which holds the output voltage of the first clocked inverter 61 during a certain period synchronized with the clock signal CK.

The unit shift register of the leading stage is connected through the first transfer gate 64 to a terminal to which the start pulse signal ST is supplied. The unit shift register of the last stage (nth stage) is connected through the second transfer gate 65 to the terminal to which the start pulse signal ST is supplied.

In each unit shift register, the input terminal of the first clocked inverter 61 is connected through the first transfer gate 64 to the output terminal of the first clocked inverter 61 in the unit shift register of the preceding stage. Further, the input terminal of the first clocked inverter 61 is also connected through the second transfer gate 65 to the output terminal of the first clocked inverter 61 in the unit shift register of the following stage.

Figure 3A:
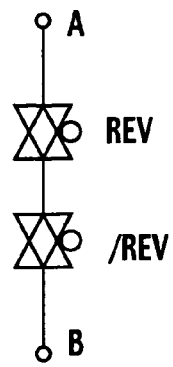
FIGS. 3A to 3D are diagrams for explaining transfer gates.
Figure 3B:
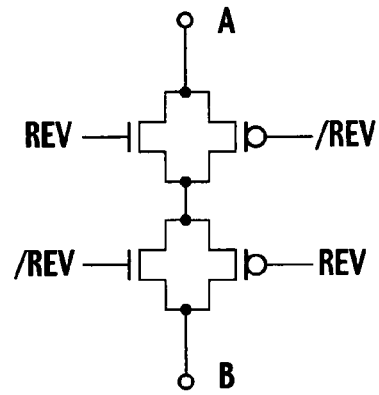
Figure 3C:
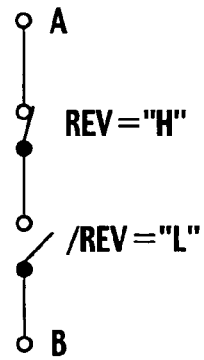
Figure 3D:
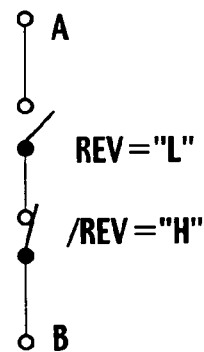

Here, the first and second transfer gates 64 and 65 will be described using FIGS. 3A to 3D. FIG. 3A illustrates schematic symbols expressing transfer gates. FIG. 3B is a circuit diagram illustrating the transfer gates. FIGS. 3C and 3D are equivalent circuits.

The transfer gates are switched using the control signal REV for scan direction control and the inverted control signal /REV, which is the inverse of the control signal REV.

That is, when the control signal REV is at a high level and the inverted control signal /REV is at a low level, the switch to which the control signal REV is inputted is turned on and the switch to which the inverted control signal /REV is inputted is turned off as illustrated in FIG. 3C. On the other hand, when the control signal REV is at a low level and the inverted control signal /REV is at a high level, the switch to which the control signal REV is inputted is turned off and the switch to which the inverted control signal /REV is inputted is turned on as illustrated in FIG. 3D.

The liquid crystal display device of this embodiment differs from known ones in the control of the clock signal CK in switching the scan direction. This control will be described using FIGS. 4 and 5.

Figure 4:
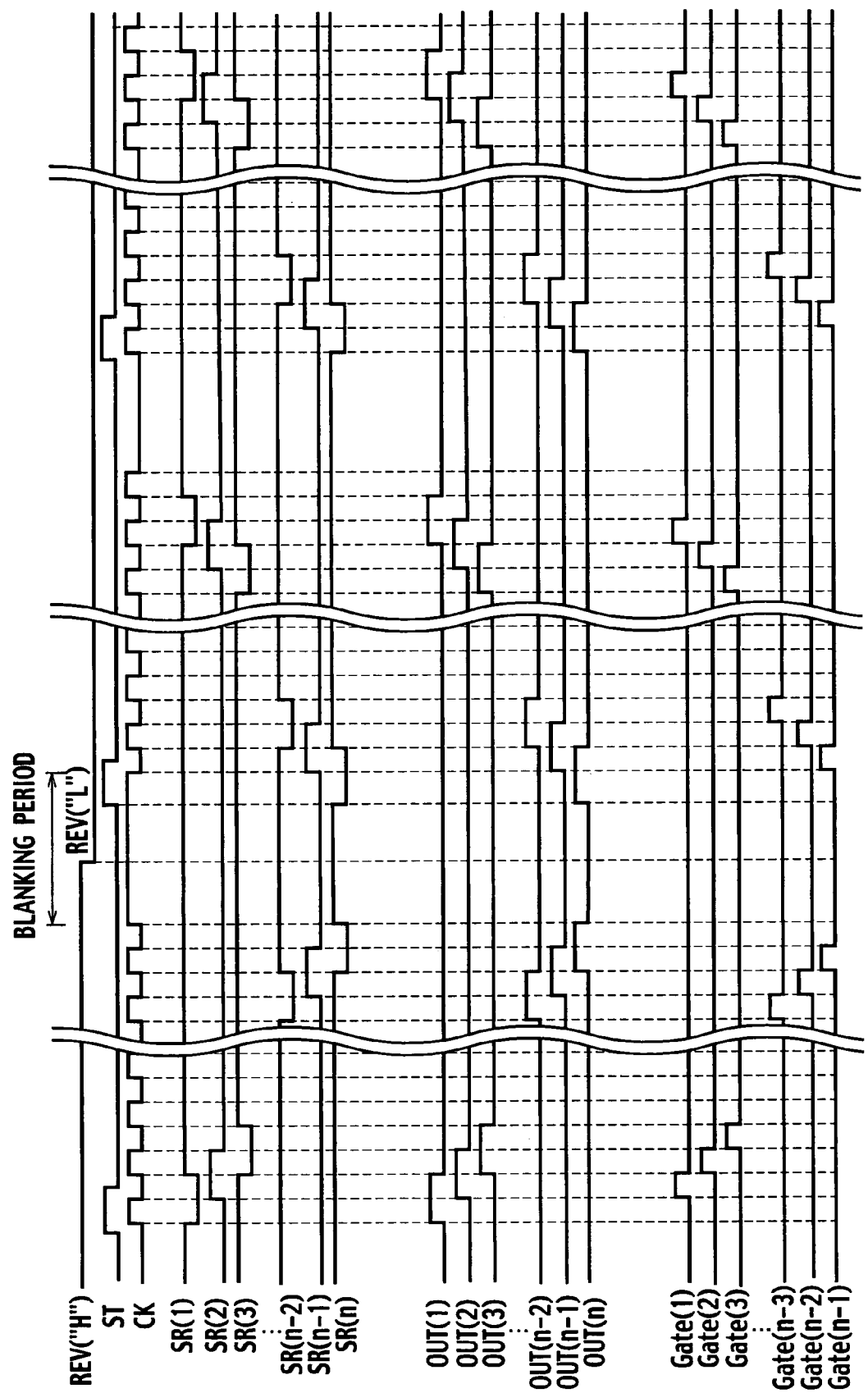
FIG. 4 illustrates a timing chart for the case where the scan direction is switched from the forward direction to the reverse direction by the bidirectional-shift register driver.

FIG. 4 is a timing chart for the case where the scan direction switches from the forward direction to the reverse direction. In this drawing, SR(1) to SR(n) are output voltage waveforms of the clocked inverters 61 and 62, OUT(1) to OUT(n) are output voltage waveforms of the bidirectional shift register 9, and Gate(1) to Gate(n−1) are output voltage waveforms of the buffers 11. Here, in the above-described switching, the control signal REV changes from a high level to a low level.

When the control signal REV is at a high level, a forward scan is performed in which the scan lines are sequentially driven in the order from Gate(1) to Gate(n−1). On the other hand, when the control signal REV is at a low level, a reverse scan is performed in which the scan lines are sequentially driven in the order from Gate(n−1) to Gate(1). In this case, an image inverted in the scan direction is displayed.

In the liquid crystal display device, the clock signal CK is fixed to a high level by the control circuit 12 around the timing of this switching. This drawing illustrates as one example a situation in which the scan direction is assumed to be switched in a vertical blanking interval and in which the clock signal CK is held at a high level in a vertical blanking interval.

Figure 2:
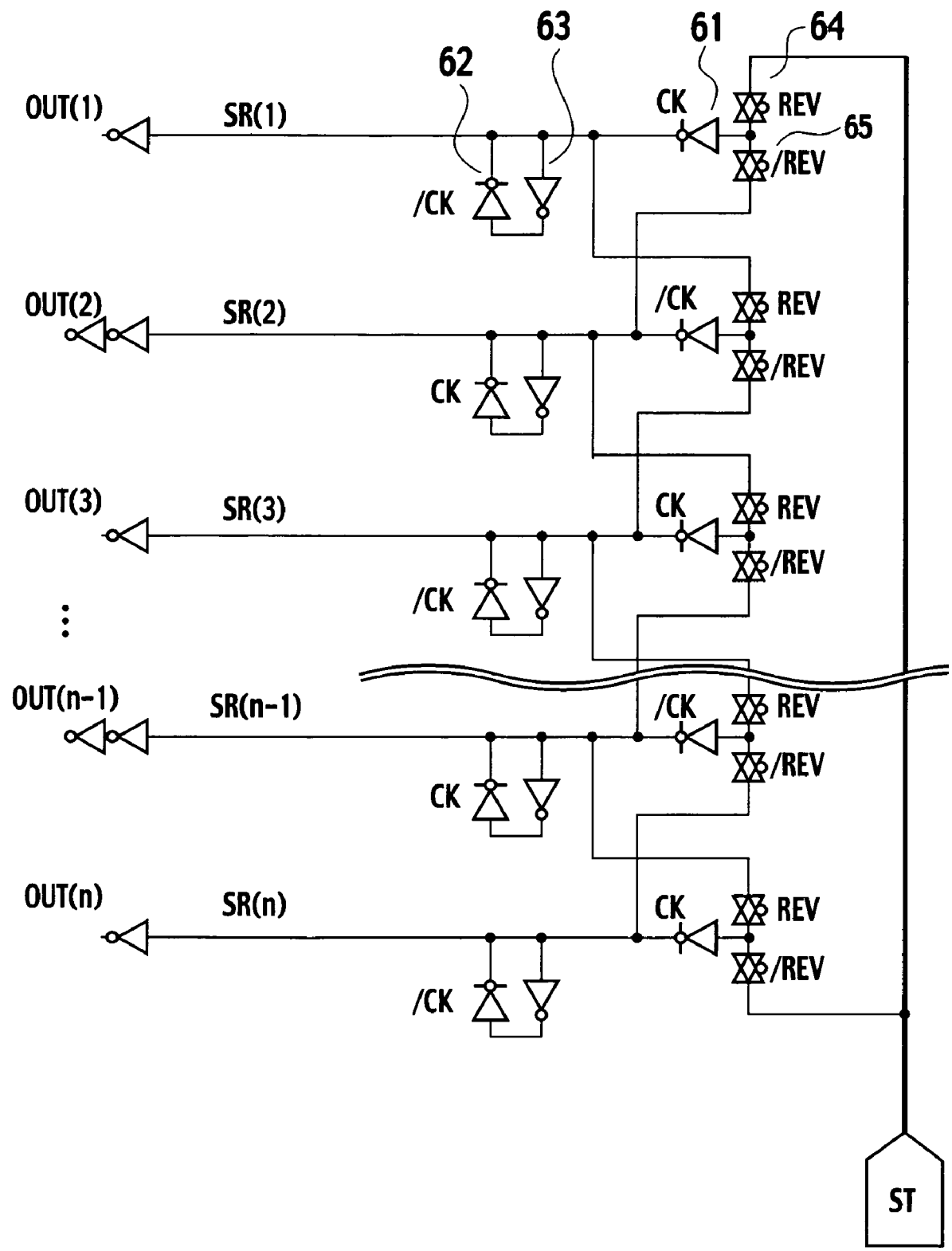
FIG. 2 illustrates the circuit configuration of a bidirectional shift register.

By the above-described timing control of the clock signal CK, the first clocked inverters 61 of the odd-numbered stages of the bidirectional shift register illustrated in FIG. 2 are fixed to ON states when the scan direction is switched from the forward direction to the reverse direction.

Figure 5:
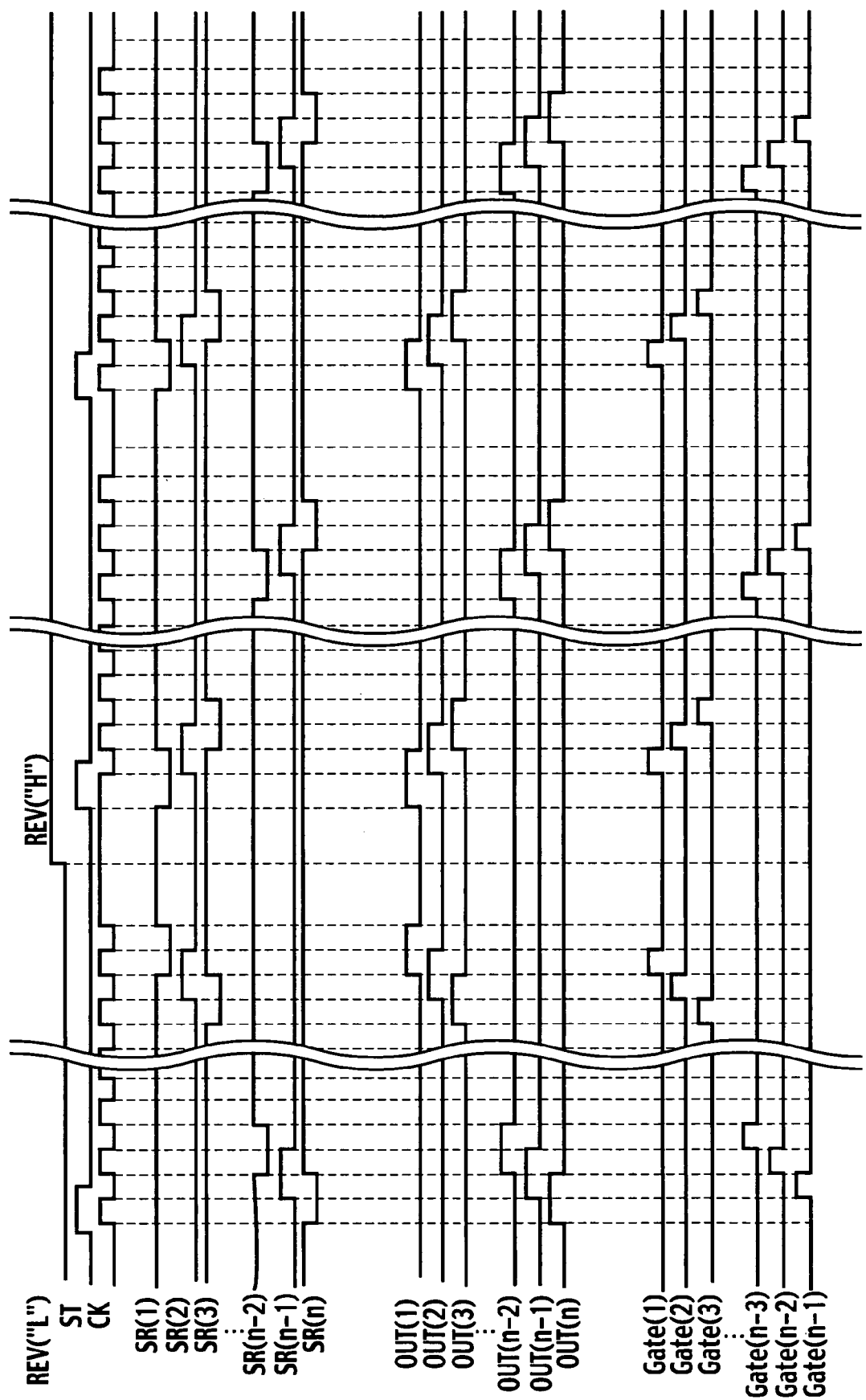
FIG. 5 illustrates a timing chart for the case where the scan direction is switched from the reverse direction to the forward direction by the bidirectional-shift register driver.

FIG. 5 is a timing chart for the case where the scan direction switches from the reverse direction to the forward direction. In this case, the control signal REV changes from a low level to a high level. Around the timing of this switching, the clock signal CK is fixed to a high level by the control circuit 12. This drawing also illustrates a situation in which the clock signal CK is held at a high level in a vertical blanking interval.

Thus, by controlling the clock signal CK to a high level when the scan direction is switched from the reverse direction to the forward direction, the first clocked inverters 61 of the odd-numbered stages of the bidirectional shift register illustrated in FIG. 2 are fixed to ON states. This enables the first clocked inverters 61 of the odd-numbered stages to output proper voltages based on the start pulse signal inputted to the leading or last stage.

Next, in order to facilitate the understanding of effects of this embodiment, a shift register of a comparative example will be described. The basic configuration of the bidirectional shift register of the comparative example is the same as that of FIG. 2. However, in the comparative example, the scan direction is switched by bringing either the first transfer gates 64 or the second transfer gates 65 into conduction. The operation of the bidirectional shift register at this time will be described.

Figure 6:
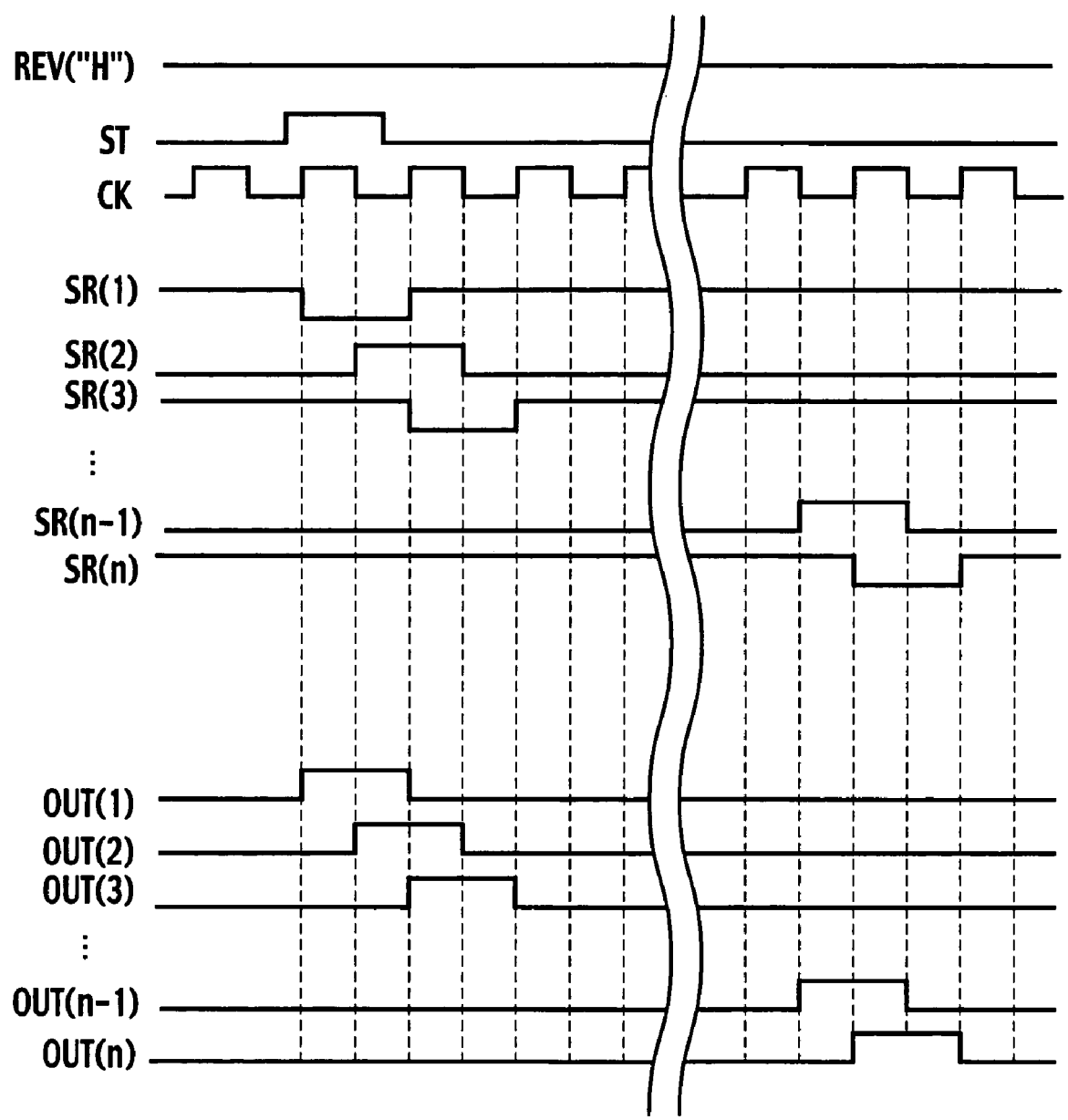
FIG. 6 illustrates a timing chart of a forward scan in a bidirectional shift register of a comparative example.

FIG. 6 is a timing chart illustrating the operation in a forward scan in which a control signal REV is at a high level. Here, ST is a start pulse signal, and CK is a clock signal. Further, though not illustrated, an inverted clock signal /CK, which is the inverse of the clock signal CK, is also used as a control signal.

In this drawing, SR(1) to SR(n) are output waveforms of the first clocked inverters 61 in the unit shift registers of the respective stages. The unit shift registers propagate the start pulse ST while delaying the phase of the start pulse ST. Further, OUT(1) to OUT(n) are positive logic pulses into which the waveforms of SR(1) to SR(n) are shaped. This is realized by, in output stages of the bidirectional shift register, providing an odd number of inverters at the output terminal of the first clocked inverter 61 of each odd-numbered stage and providing an even number of inverters at the output terminal of the first clocked inverter 61 of each even-numbered stage.

In a forward scan, in the unit shift register of each stage, the first transfer gate 64 is turned on and the second transfer gate 65 is turned off, because the control signal REV is at a high level and the inverted control signal /REV is at a low level. Thus, the start pulse ST is propagated from the leading stage to the last stage (nth stage) through the transfer gate 64 and the first clocked inverter 61 of each stage.

Specifically, in the shift register of the leading stage, when the start pulse ST at a high level is inputted, the first clocked inverter 61 inverts the start pulse signal ST to output a low-level signal in a period in which the clock signal CK is at a high level. In a period in which the inverted clock signal /CK is at a high level, a low-level signal (signal SR(1) in FIG. 6), which is the output at the time when the first clocked inverter has been last in an ON state, is latched and outputted by a latch circuit including the second clocked inverter 62 and the inverter 63.

In the shift register of the second stage, the first clocked inverter 61 of the second stage inverts the low-level signal from the first clocked inverter 61 of the preceding stage to output a high-level signal in a period in which the inverted clock signal /CK is at a high level. In a period in which the clock signal CK is at a high level, a high-level signal (signal SR(2) in FIG. 6), which is the output at the time when the first clocked inverter 61 has been last in an ON state, is latched and outputted by a latch circuit including the second clocked inverter 62 and the inverter 63. The similar operation is conducted in the shift registers in the third and following stages.

As illustrated in the timing chart of FIG. 6, output pulses sequentially shift in the order from OUT(1) to OUT(n) in a state in which they overlap by one-clock width, because the unit shift registers operate as described above.

Figure 7:
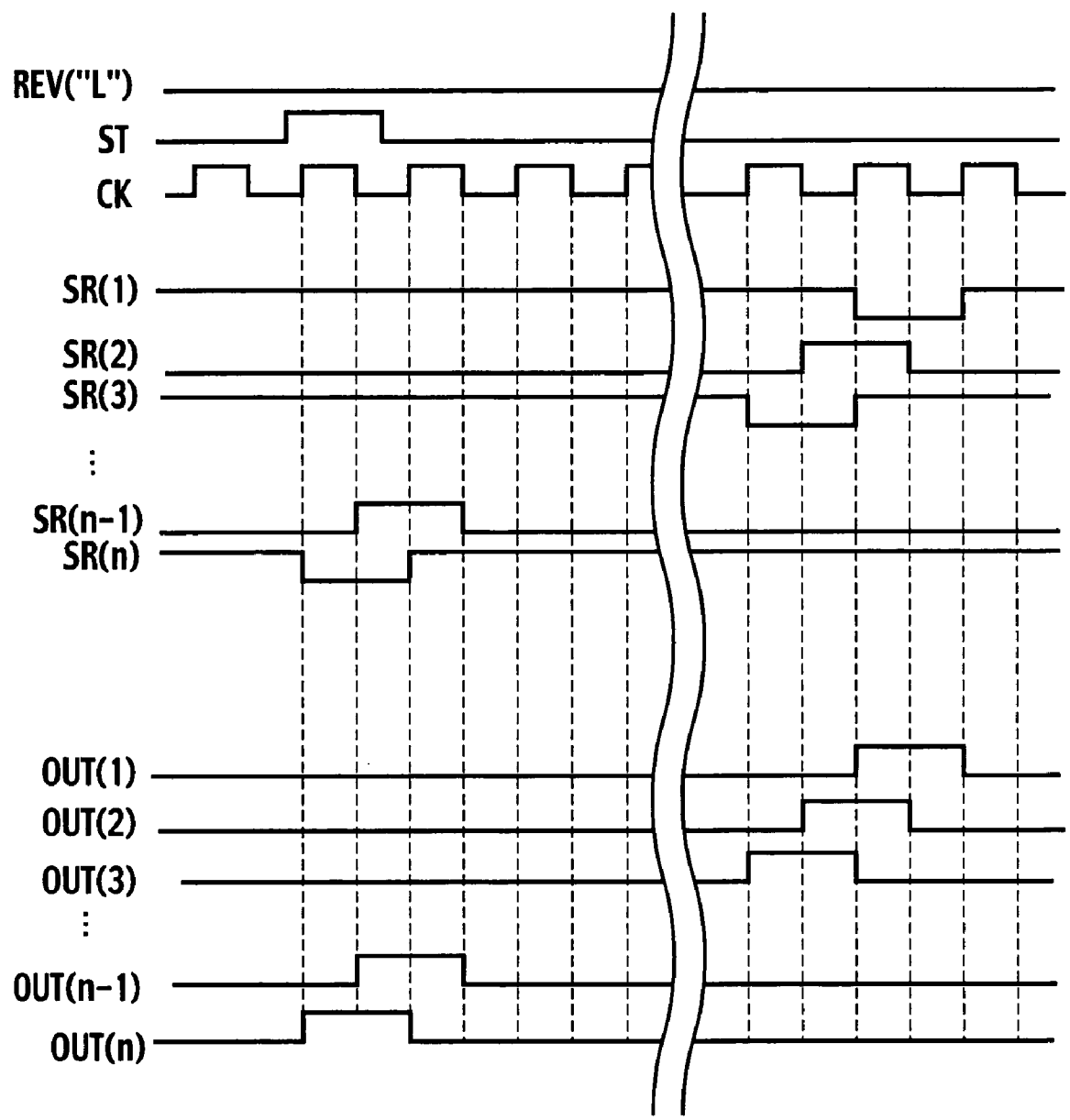
FIG. 7 illustrates a timing chart of a reverse scan in the bidirectional shift register of the comparative example.

FIG. 7 is a timing chart illustrating the operation in a reverse scan in which the control signal REV is at a low level. In a reverse scan, in the unit shift register of each stage, the first transfer gate 64 is turned off and the second transfer gate 65 is turned on, because the control signal REV is at a low level and the inverted control signal /REV is at a high level. Thus, the start pulse signal ST is propagated from the last stage to the leading stage through the transfer gate 65 and the first clocked inverter 61 of each stage.

Specifically, in the shift register of the last stage (nth stage), when the start pulse ST at a high level is inputted, the first clocked inverter 61 inverts the start pulse signal ST at a high level to output a low-level signal in a period in which the clock signal CK is at a high level. In a period in which the inverted clock signal /CK is at a high level, a low-level signal (signal SR(n) in FIG. 7), which is the output at the time when the first clocked inverter 61 has been last in an ON state, is latched and outputted by a latch circuit including the second clocked inverter 62 and the inverter 63.

In the shift register of the (n−1)th stage, the first clocked inverter 61 of the (n−1)th stage inverts the low-level signal from the first clocked inverter 61 of the last stage to output a high-level signal in a period in which the inverted clock signal /CK is at a high level. In a period in which the clock signal CK is at a high level, a high-level signal (signal SR(n−1) in FIG. 7), which is the output at the time when the first clocked inverter 61 has been last in an ON state, is latched and outputted by a latch circuit including the second clocked inverter 62 and the inverter 63.

As illustrated in the timing chart of FIG. 7, output pulses sequentially shift in the order from OUT(n) to OUT(1) in a state in which they overlap by one-clock width, because the unit shift registers in the stages operate as described above. Thus, a bidirectional shift register is realized.

Figure 8A:
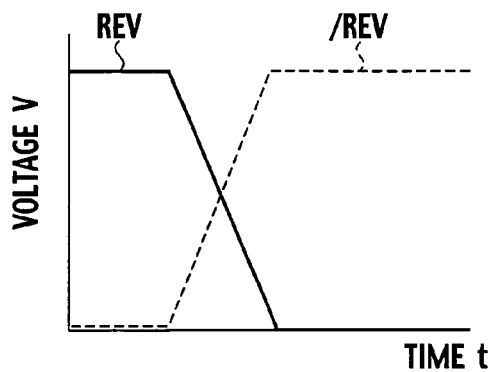
FIG. 8A illustrates the voltage waveforms of a control signal REV and an inverted control signal /REV for the case where there is no delay difference when the control signal REV turns from a high level to a low level, and the waveform of current flowing through first and second transfer gates at this time.
Figure 8A:
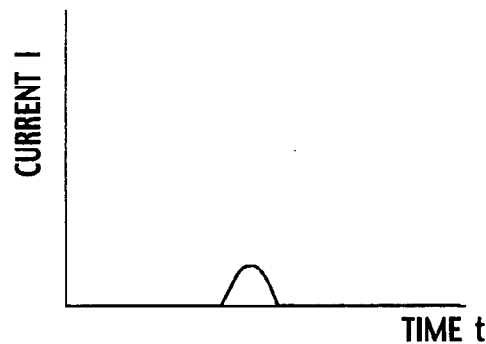

In the case where, as illustrated in the upper portion of FIG. 8A, there is not a significant delay difference between the control signal REV and the inverse /REV thereof, which switch the first and second transfer gates 64 and 65 between ON and OFF states, a current I flowing between the first and second transfer gates 64 and 65 is momentary and very small as illustrated in the lower portion of FIG. 8A. Accordingly, there is almost no problem.

Figure 8B:
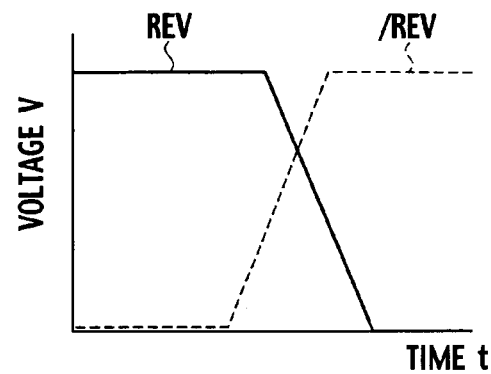
FIG. 8B illustrates the voltage waveforms of the control signal REV and the inverted control signal /REV for the case where there is a significant delay in the control signal REV, and the waveform of current flowing through the first and second transfer gates at this time.
Figure 8B:
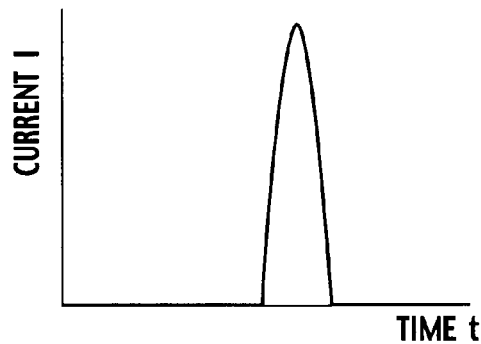
Figure 9:
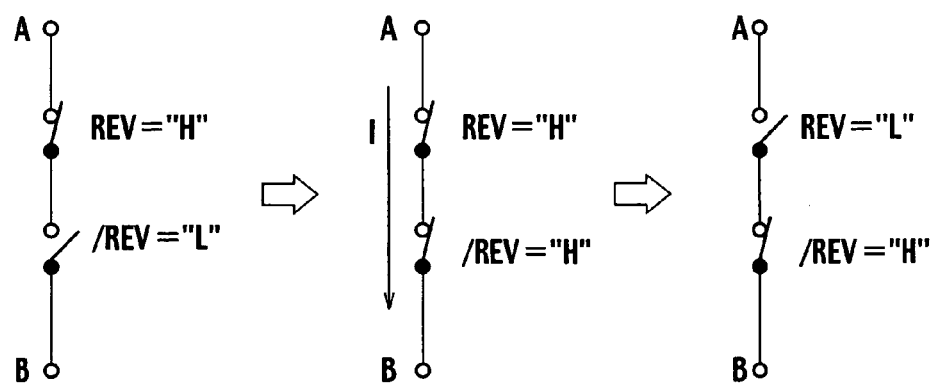
FIG. 9 illustrates the transition of an equivalent circuit of the first and second transfer gates for the case where there is a significant delay in the control signal REV when the control signal REV turns from a high level to a low level.

However, in the case, for example, where the control signal REV is greatly delayed relative to the inverse /REV thereof, there is a period in which both of the control signal REV and the inverse /REV thereof are at high levels in the switching thereof as illustrated in the upper portion of FIG. 8B. In this period, since both of the first and second transfer gates 64 and 65 are conducting, a large current I flows between the first and second transfer gates as illustrated in the lower portion of FIG. 8B. FIG. 9 is a diagram illustrating the transition of the first and second transfer gates 64 and 65 between ON and OFF states at this time.

In general, the switching of the scan direction in the display of images showing continuous action is performed in a blanking interval of a vertical scan in order to prevent the occurrence of noise and display disturbance before they occur. In this blanking interval, the clock CK supplied to the bidirectional shift register is fixed to a low level.

At this time, in the unit shift register of each odd-numbered stage, the first clocked inverter 61 is in an OFF state. In an output interconnection of the first clocked inverter 61, a high-level potential at the time when the first clocked inverter 61 has been last in an ON state is held by a latch circuit including the second clocked inverter 62 and the inverter 63.

In such a state, in the case where the control signal REV and the inverted control signal /REV, which control the scan direction, are inverted, the potential of the output interconnection of the first clocked inverter 61 in the unit shift register of each odd-numbered stage, which first clocked inverter 61 is in an OFF state, fluctuates under the influence of potential fluctuations in the control signal REV and the inverted control signal /REV, because of coupling through the parasitic capacitance between an interconnection for the control signal REV and the output interconnection of the first clocked inverter 61, the parasitic capacitance between an interconnection for the inverted control signal /REV and the interconnection for the output terminal of the first clocked inverter 61, or the like.

In particular, when the control signal REV changes from a high level to a low level, this change causes the potential of the output interconnection of the first clocked inverter 61 to be lowered from a high level to a low level. This low-level potential is captured by the latch circuit including the inverter 63 and the second clocked inverter 62. In the case where a low-level potential is accidentally captured by the latch circuit as described above, the potential of the output interconnection of the first clocked inverter 61 is thereafter maintained at a low level.

Figure 10:
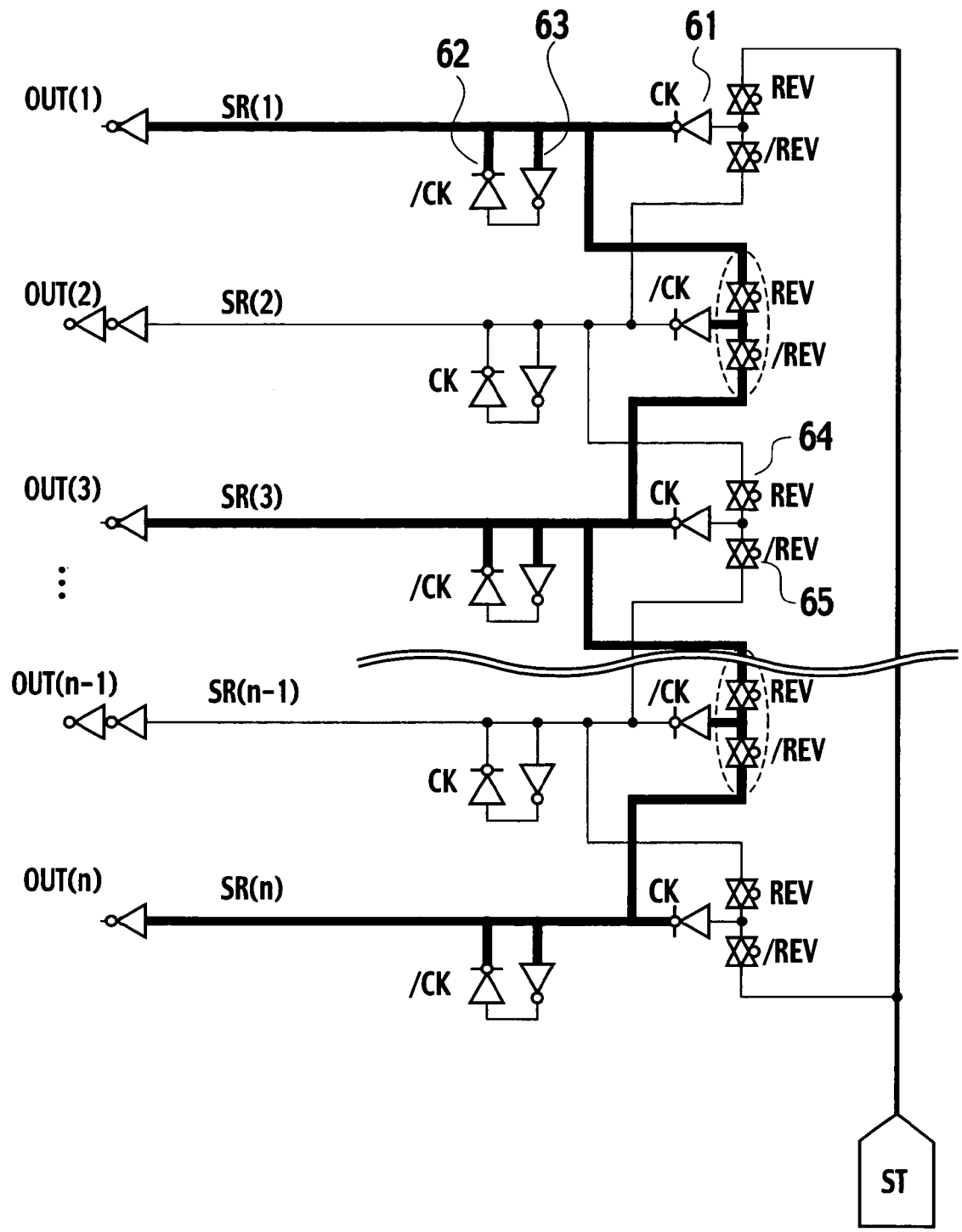
FIG. 10 illustrates a situation in which in the comparative example, in the case where a clock signal CK is fixed at a low level when the control signal REV turns from a high level to a low level, incorrect output signals of first clocked inverters of odd-numbered stages propagate when the first and second transfer gates are conducting at the same time because of malfunction.

Further, as described previously, in the case where there occurs a large delay difference between the control signal REV and the inverse /REV thereof, both of the first and second transfer gates 64 and 65 are conducting. Accordingly, all of the potentials of the output interconnections for the first clocked inverters 61 of the odd-numbered stages which are indicated by thick lines in FIG. 10 are lowered to low levels. Thus, all of the odd-numbered stages malfunction.

Also, the first clocked inverters 61 of the even-numbered stages are in ON states, and therefore capture low-level potentials, which are the potentials of the output interconnections of the first clocked inverters 61 of the odd-numbered stages, respectively. As a result, malfunction occurs in the outputs of the unit shift registers of all the stages. Problems caused by this malfunction will be described below.

Figure 11:
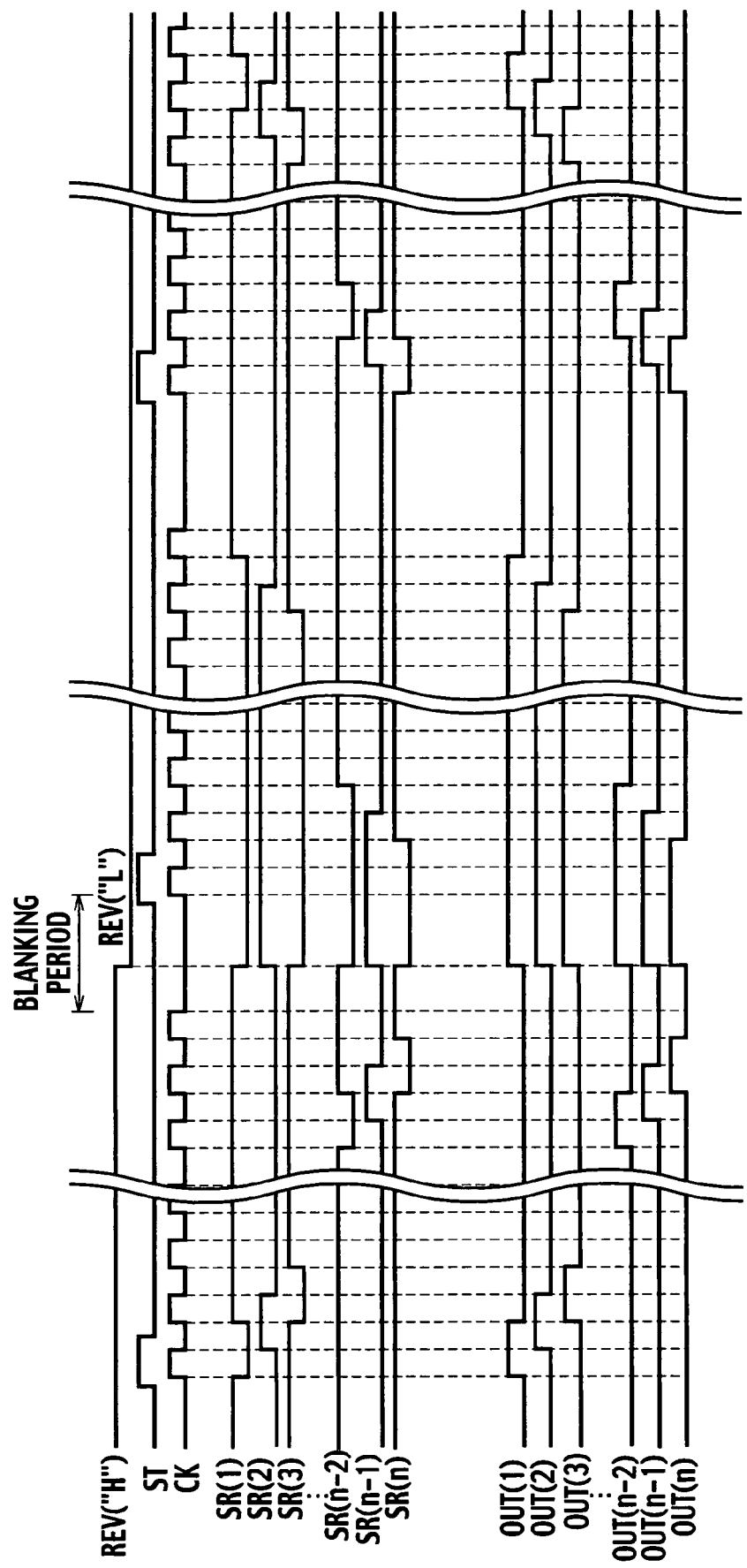
FIG. 11 illustrates a timing chart for the case where the scan direction is switched from the forward direction to the reverse direction by a bidirectional-shift register driver of the comparative example.

FIG. 11 is a timing chart for the case where the scan direction switches from the forward direction (REV is at a high level) to the reverse direction (REV is at a low level) in the comparative example.

At the timing of the switching of the REV signal, the unit shift register of each stage malfunctions. All of the output signals OUT(1) to OUT(n) thereof are raised to high levels, and the pulse widths are increased. Accordingly, in the case where these output signals OUT(1) to OUT(n) are used as scan signals, all of the scan lines are turned on in a first frame immediately after the scan direction turns from the forward direction to the reverse direction. Thus, the entire screen of the display device is changed to the same brightness for a moment to seem flashing. In second and subsequent frames, proper shift register operation is performed, and the pulse widths of drive waveforms for the scan lines also become proper.

Figure 12:
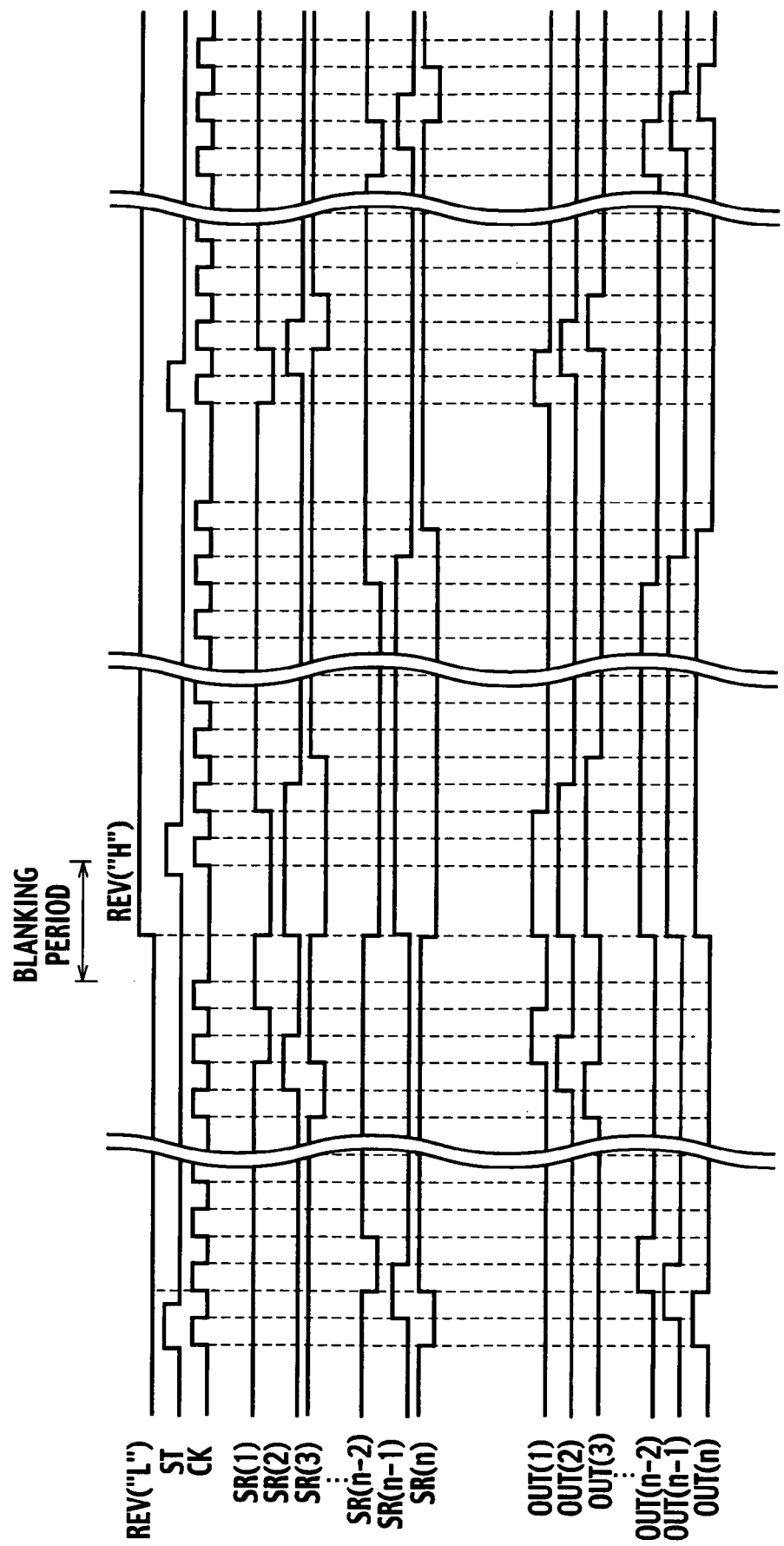
FIG. 12 illustrates a timing chart for the case where the scan direction is switched from the reverse direction to the forward direction by the bidirectional-shift register driver of the comparative example.

FIG. 12 is a timing chart for the case where the scan direction switches from the reverse direction (REV is at a low level) to the forward direction (REV is at a high level) in the comparative example.

In this case, at the timing of the switching of the REV signal, the unit shift register of each of the stages malfunctions similarly. All of the output signals OUT(1) to OUT(n) thereof are raised to high levels, and the pulse widths are increased. Accordingly, in the case where these output signals OUT(1) to OUT(n) are used as scan signals, all of the scan lines are turned on in a first frame immediately after the scan direction turns from the reverse direction to the forward direction. Thus, the entire screen of the display device is changed to the same brightness for a moment to seem flashing.

As described above, when the scan direction is switched, the entire screen is changed to the same brightness for a moment to seem flashing. Accordingly, there arises the problem that display quality is considerably impaired.

In order to avoid this flashing, for example, the following have been necessary: the scan lines are disconnected from the scan line driver in a first frame period immediately after the switching of the scan direction by, for example, providing an enable circuit in the scan line driver; and, after the output signal of the shift register of each stage is stabilized at a proper potential by operating the shift register for one vertical period, the scan lines and the scan line driver are connected in a second frame and afterward to resume display.

However, in this case, a complex circuit configuration is required. This causes an increase in the number of interconnections, an increase in circuit scale, and an increase in power consumption. Further, since a first frame of a moving video picture immediately after the switching of the propagation direction of pulse signals is interrupted, smooth display of the video cannot be obtained. Furthermore, since complex timing control is required in the switching of the propagation direction, timing design for the controller is difficult.

On the other hand, in this embodiment, the clock signal CK at a high level is given to the first clocked inverters 61 of the odd-numbered stages around the timing of switching the scan direction, whereby the first clocked inverters 61 of the odd-numbered stages are fixed to ON states.

As described above, in this embodiment, the clock signal CK at a high level is given to the first clocked inverters 61 of the odd-numbered stages around the timing of switching the scan direction. Because of this, even if the output interconnections of the first clocked inverters 61 of the odd-numbered stages are affected by potential fluctuations due to coupling through parasitic capacitances and the like, the first clocked inverters 61 of the odd-numbered stages are fixed to ON states and output proper voltages based on the start pulse signal inputted to the leading or last stage. This enables the potentials of the output interconnections to be recharged to original proper potentials. Thus, malfunction can be prevented before it occurs.

Further, in this embodiment, even if the first and second transfer gates 64 and 65 are conducting at the same time in the switching of the scan direction in each unit shift register because of a delay in the control signal REV, the potentials of the output interconnections of the first clocked inverters in the odd-numbered stages are maintained at proper potentials. Thus, malfunction can be prevented before it occurs.

In comparison with the case where an enable circuit is provided for malfunction avoidance, this embodiment does not require a significant modification of the circuit and makes it possible to improve the reliability of operation in the switching of the scan direction by merely performing easy timing settings.

In this embodiment, in the case where the bidirectional-shift register driver is applied to a display device, the pulse widths of the drive waveforms for the scan lines G denoted by Gate(1) to Gate(n−1) are not increased in a first frame immediately after the scan direction is switched, and proper scan operation is performed. Accordingly, high-quality video can be displayed.

Although an example in which the bidirectional shift register is applied to the scan line driver and in which an image is inverted in the vertical direction by switching the scan direction has been described in this embodiment, the present invention is not limited to this. For example, the bidirectional shift register may be applied to the signal line driver. In this case, an image is inverted in the horizontal direction by switching the scan direction. Alternatively, the bidirectional shift register may be applied to both of the scan line driver and the signal line driver. In this case, an image can be inverted in both of the vertical and horizontal directions. In any of those cases, the reliability of operation in the switching of the scan direction can be improved by adopting the bidirectional-shift register driver.

Second Embodiment

Figure 13:
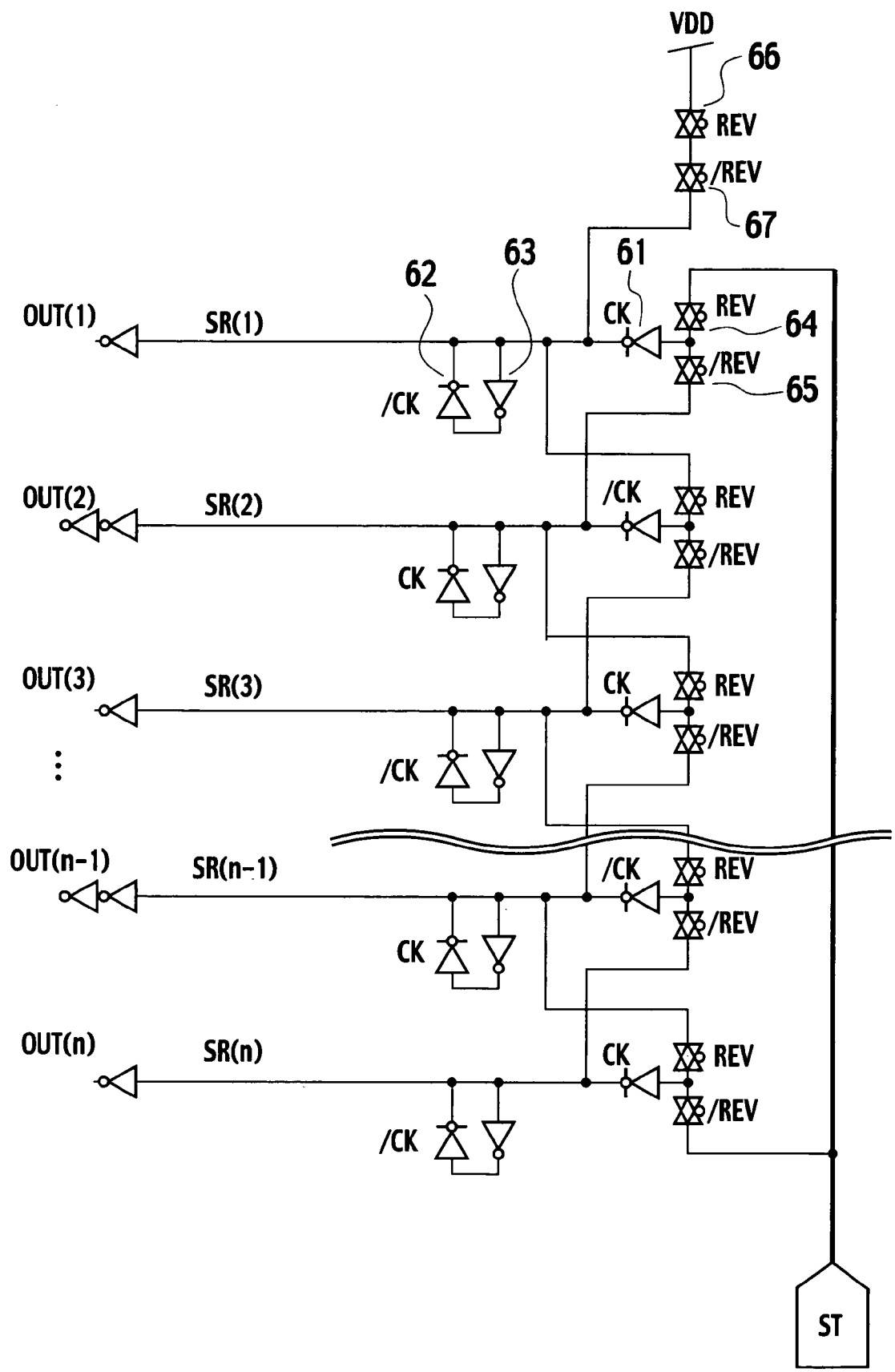
FIG. 13 illustrates the circuit configuration of a bidirectional shift register of a second embodiment.

FIG. 13 is a circuit diagram illustrating the configuration of a bidirectional shift register of this embodiment. This bidirectional shift register differs from the circuit of FIG. 2 in that the output terminal of the first clocked inverter 61 in the unit shift register of one of the odd-numbered stages is connected to a power supply VDD through a third transfer gate 66 and a fourth transfer gate 67. The third transfer gate 66 becomes conducting at the same time as the first transfer gates 64 become conducting. The fourth transfer gate 67 becomes conducting at the same time as the second transfer gates 65 become conducting.

This drawing illustrates a situation in which the output terminal of the first clocked inverter 61 in the unit shift register of the first stage is connected to the power supply VDD through the third and fourth transfer gates 66 and 67 connected in series.

The power supply VDD is a voltage source which supplies a DC voltage corresponding to a high level. The third transfer gate 66 is conducting when the control signal REV is at a high level. The fourth transfer gate 67 is conducting when the inverted control signal /REV is at a high level.

In addition, the same components as those of FIG. 2 are denoted by the same reference numerals and will not be further described here. Further, a liquid crystal display device to which this bidirectional shift register is applied basically has a configuration similar to that of the first embodiment described using FIG. 1.

With the above-described configuration of the bidirectional shift register, even if the potentials of the output interconnections of the first clocked inverters of the odd-numbered stages fluctuate because of coupling or the like to become different from original proper potentials when the scan direction is switched, or even if the first and second transfer gates 64 and 65 are conducting at the same time because of the occurrence of a significant delay difference between the control signal REV and the inverse /REV thereof when the scan direction is switched, the third and fourth transfer gates 66 and 67 are also conducting at the same time. Thus, proper potentials are supplied from the power supply VDD through the third and fourth transfer gates 66 and 67 to the output interconnections of the first clocked inverters 61 of the odd-numbered stages regardless of whether the first clocked inverters 61 of the odd-numbered stages are in ON or OFF states.

When the potentials of the output interconnections of the first clocked inverters 61 are firmly fixed at proper levels, even if the first and second transfer gates 64 and 65 are conducting at the same time because of a delay difference between the control signal REV and the inverse /REV thereof, the outputs of the first clocked inverters 61 of all the odd-numbered stages are firmly fixed at proper potentials.

Further, since these proper potentials also become inputs for the first clocked inverters 61 of the even-numbered stages, the output potentials of the first clocked inverters 61 of all the even-numbered stages are also firmly fixed at proper potentials.

Next, the operation of a liquid crystal display device to which this bidirectional shift register is applied will be described using FIGS. 14 and 15.

Figure 14:
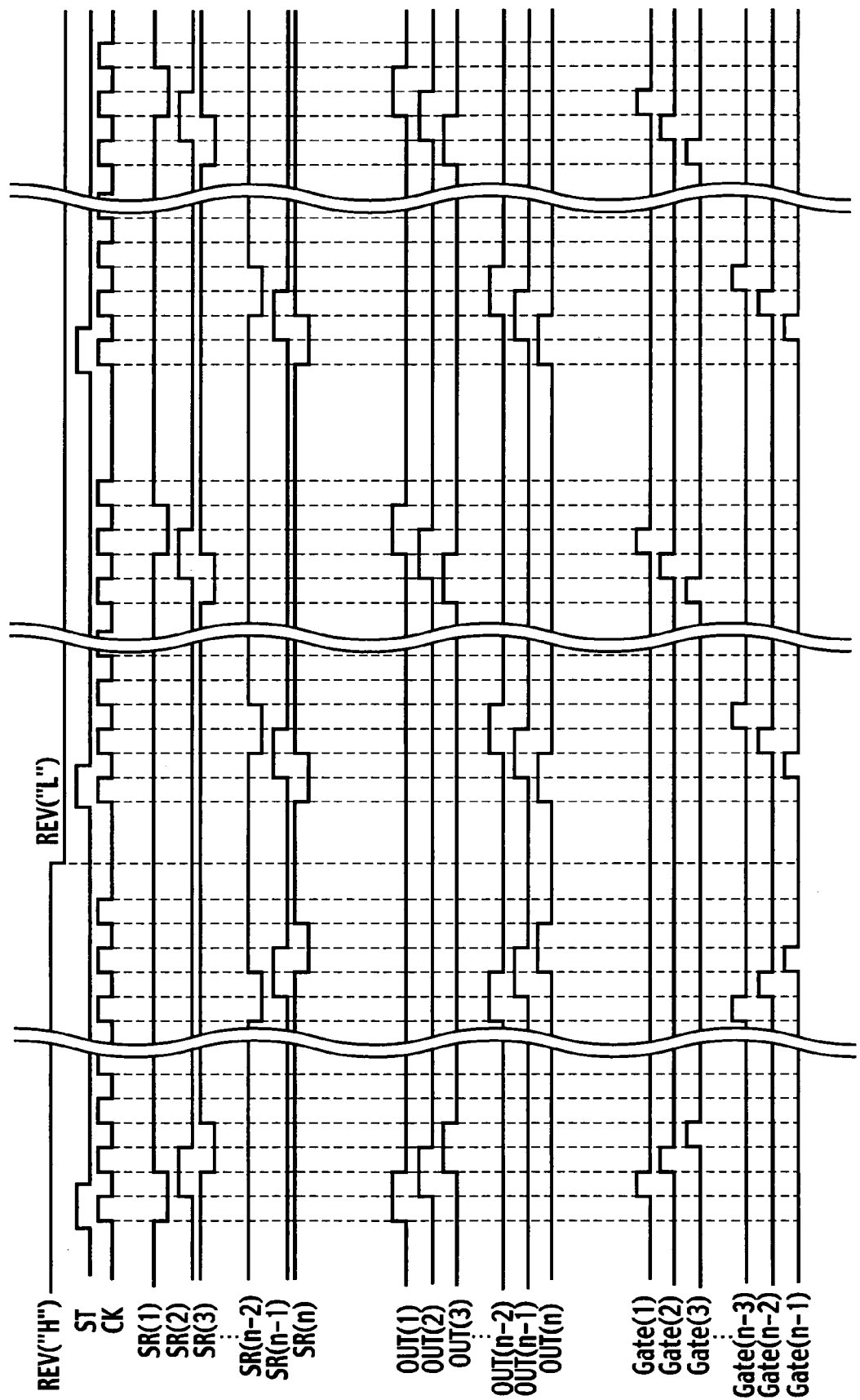
FIG. 14 illustrates a timing chart for the case where the scan direction is switched from the forward direction to the reverse direction by a driver for the bidirectional shift register.

FIG. 14 is a timing chart for the case where the scan direction switches from the forward direction to the reverse direction. The operation timings of the control signal REV for the scan direction, the start pulse ST, and the clock CK are the same as those of FIG. 11.

As described previously, this bidirectional shift register can prevent malfunction before it occurs. Accordingly, as illustrated in FIG. 14, the pulse widths of the drive waveforms for the scan lines G denoted by Gate(1) to Gate(n−1) are not increased in a first frame immediately after the scan direction turns from the forward direction to the reverse direction, and proper scan operation is performed.

Figure 15:
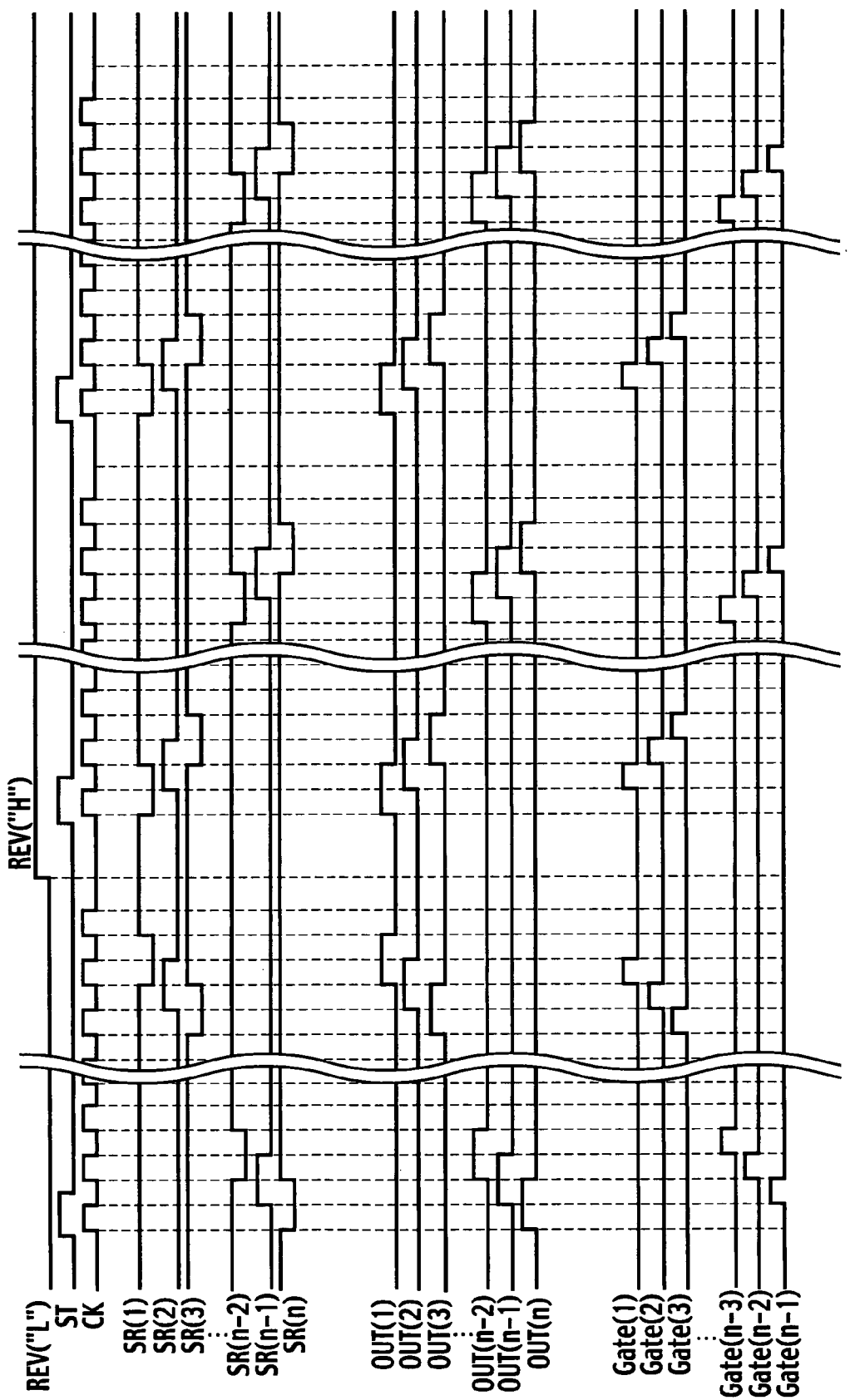
FIG. 15 illustrates a timing chart for the case where the scan direction is switched from the reverse direction to the forward direction by the driver for the bidirectional shift register.

FIG. 15 is a timing chart for the case where the scan direction switches from the reverse direction to the forward direction. The operation timings of the control signal REV for the scan direction, the start pulse ST, and the clock CK are the same as those of FIG. 12.

As illustrated in FIG. 15, the pulse widths of the drive waveforms for the scan lines G denoted by Gate(1) to Gate(n−1) are also not increased in a first frame immediately after the scan direction is switched from the reverse direction to the forward direction, and proper scan operation is performed.

As described above, in this embodiment, the output terminal of the first clocked inverter 61 in the unit shift register of an odd-numbered stage is connected to the power supply VDD through the third transfer gate 66, which becomes conducting at the same time as the first transfer gates 64 do, and the fourth transfer gate 67, which becomes conducting at the same time as the second transfer gates 65 do. Thus, in the switching of the scan direction, even if the first and second transfer gates 64 and 65 are conducting at the same time because there occurs a significant delay difference between the control signal REV and the inverted control signal /REV for scan direction switching, the third and fourth transfer gates 66 and 67 are also conducting at the same time. Accordingly, proper potentials are supplied from the power supply VDD through the third and fourth transfer gates 66 and 67 to the output interconnections of the first clocked inverters 61 of the odd-numbered stages regardless of whether the first clocked inverters 61 of the odd-numbered stages are in ON or OFF states. Thus, malfunction can be prevented before it occurs.

In comparison with the case where an enable circuit is provided in order to avoid flashing in the switching of the scan direction, this embodiment does not require a significant modification of the circuit and a modification of timing control, and makes it possible to improve the reliability of operation.

Further, in the case where the driver for the bidirectional shift register of this embodiment is applied to a display device, the pulse widths of the drive waveforms for the scan lines G denoted by Gate(1) to Gate(n−1) are not increased in a first frame immediately after the scan direction is switched, and proper scan operation is performed. Accordingly, high-quality video can be displayed.

It should be noted that though the power supply VDD is connected to the output terminal of the first clocked inverter 61 of the leading stage through the third and fourth transfer gates 66 and 67 in this embodiment, the present invention is not limited to this. The power supply VDD may be connected to the output terminal of the first clocked inverter 61 of other odd-numbered stage through the third and fourth transfer gates 66 and 67. In this case, similar effects to the above-described ones can also be obtained.

What is claimed is:

1. A driver which drives a bidirectional shift register including a plurality of stages of unit shift registers connected to each other,
wherein each shift register comprises:
a first clocked inverter;
an inverter having an input terminal connected to an output terminal of the first clocked inverter;
a second clocked inverter having an input terminal connected to an output terminal of the inverter and having an output terminal connected to a connection point between the first clocked inverter and the inverter;
a first transfer gate having one end connected to an input terminal of the first clocked inverter; and
a second transfer gate having one end connected to a connection point between the first clocked inverter and the first transfer gate,
wherein in the bidirectional shift register,
other end of the first transfer gate in the unit shift register of the leading stage and other end of the second transfer gate in the unit shift register of the last stage are connected to a terminal to which a start pulse signal is supplied,
in each of the unit shift registers of other stages, other end of the first transfer gate is connected to the output terminal of the first clocked inverter in the unit shift register of the preceding stage, and other end of the second transfer gate is connected to the output terminal of the first clocked inverter in the unit shift register of the following stage,
in each of the unit shift registers of the odd-numbered stages, the first clocked inverter operates in a period in which a clock signal is at a high level, and the second clocked inverter operates in a period in which an inverted clock signal is at a high level,
in each of the unit shift registers of the even-numbered stages, the first clocked inverter operates in a period in which the inverted clock signal is at a high level, and the second clocked inverter operates in a period in which the clock signal is at a high level, and
a scan direction is switched by bringing any one of the first and second transfer gates in each unit shift register into conduction,
wherein the driver comprises a controller which fixes the clock signal of the bidirectional shift register to a high level around the timing of the switching of the scan direction.

2. A bidirectional shift register including a plurality of stages of unit shift registers connected to each other,
wherein each shift register comprises:
a first clocked inverter;
an inverter having an input terminal connected to an output terminal of the first clocked inverter;
a second clocked inverter having an input terminal connected to an output terminal of the inverter and having an output terminal connected to a connection point between the first clocked inverter and the inverter;
a first transfer gate having one end connected to an input terminal of the first clocked inverter; and
a second transfer gate having one end connected to a connection point between the first clocked inverter and the first transfer gate, and
wherein in the bidirectional shift register,
other end of the first transfer gate in the unit shift register of the leading stage and other end of the second transfer gate in the unit shift register of the last stage are connected to a terminal to which a start pulse signal is supplied,
in each of the unit shift registers of other stages, other end of the first transfer gate is connected to the output terminal of the first clocked inverter in the unit shift register of the preceding stage, and other end of the second transfer gate is connected to the output terminal of the first clocked inverter in the unit shift register of the following stage,
in each of the unit shift registers of the odd-numbered stages, the first clocked inverter operates in a period in which a clock signal is at a high level, and the second clocked inverter operates in a period in which an inverted clock signal is at a high level, in each of the unit shift registers of the even-numbered stages, the first clocked inverter operates in a period in which the inverted clock signal is at a high level, and the second clocked inverter operates in a period in which the clock signal is at a high level, and a scan direction is switched by bringing any one of the first and second transfer gates in each unit shift register into conduction, wherein the bidirectional shift register comprises:

a third transfer gate which becomes conducting at the same time as the first transfer gates;

a fourth transfer gate which becomes conducting at the same time as the second transfer gates; and a power supply to which the output terminal of the first clocked inverter in the unit shift register of any one of the odd-numbered stages is connected through the third and fourth transfer gates.

\* \* \* \* \*